United States Patent [19]
Chen

[11] Patent Number: 5,868,803
[45] Date of Patent: Feb. 9, 1999

[54] METHOD FOR MOUNTING A WAFER LOADING DEVICE TO A PROCESS MACHINE

[75] Inventor: Shie Home Chen, Taichung, Taiwan

[73] Assignee: Taiwan Semiconductor Manufacturing Co. Ltd., Hsin-Chu, Taiwan

[21] Appl. No.: 821,274

[22] Filed: Mar. 20, 1997

[51] Int. Cl.[6] .................................................. H01L 21/68
[52] U.S. Cl. ...................... 29/25.01; 414/935; 211/41.1
[58] Field of Search ........................... 29/25.01; 414/935; 211/41.1

[56] References Cited

U.S. PATENT DOCUMENTS 4,764,076  8/1988  Layman et al. .
4,974,166  11/1990  Maney et al. .
5,166,884  11/1992  Maney et al. .

*Primary Examiner*—David Graybill
*Attorney, Agent, or Firm*—Tung & Associates

[57] ABSTRACT

The present invention discloses a method for mounting a peripheral device, such as a wafer loading device, to a semiconductor process tool that includes sensor means in the mounting surface of the peripheral device such that improper mounting between the two components can be detected and a signal can be sent out to a host computer to disable the peripheral device and to stop its motion and thus prevent any damages to the components or the substrates it carries. The peripheral device may further include spring means mounted in its mounting surface to enable the peripheral device to be pushed away from the process tool to provide a visual indication to a machine operator when the two components are not properly mounted together.

16 Claims, 1 Drawing Sheet

U.S. Patent      Feb. 9, 1999      5,868,803
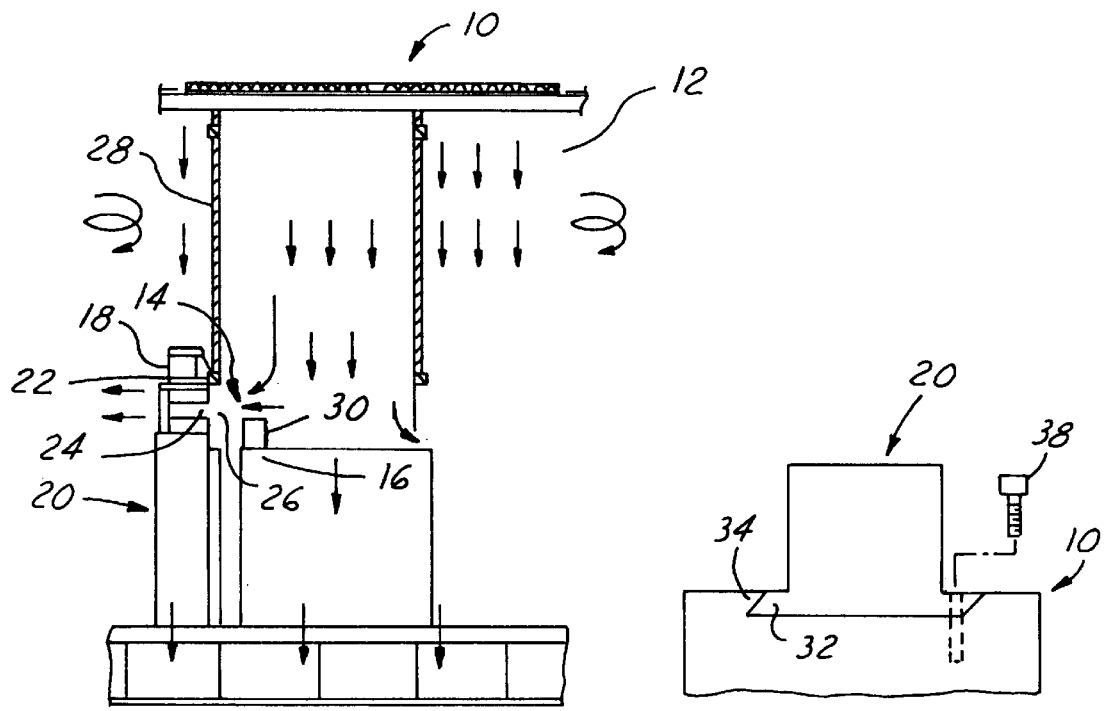
(PRIOR ART)
FIG. 1
(PRIOR ART)
FIG. 2
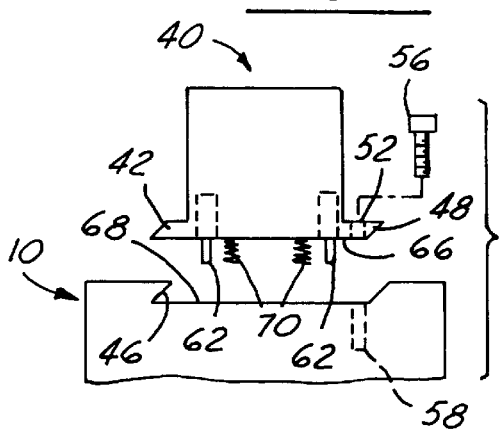
FIG. 3
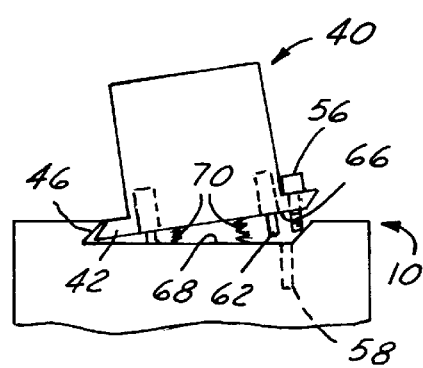
FIG. 4

METHOD FOR MOUNTING A WAFER LOADING DEVICE TO A PROCESS MACHINE

FIELD OF THE INVENTION

The present invention generally relates to a method for mounting a peripheral device to a semiconductor process machine and more particularly, relates to a method for mounting a wafer loading device to a semiconductor process machine by providing microswitches and springs in the mounting surface of the loading device such that a signal can be sent to a controller to disable the loading device when a condition is detected wherein the loading device is not securely mounted to the process machine.

BACKGROUND OF THE INVENTION

In the recent development of semiconductor fabrication technology, the continuous miniaturization in device fabricated demands more stringent requirements in the fabrication environment and contamination control. When the feature size was in the 2 µm range, a cleanliness class of 100~1000 (which means the number of particles at sizes larger than 0.5 µm per cubic foot) was sufficient. However, when the feature size is reduced to 0.25 µm, a cleanliness class of 0.1 is required. It has been recognized that an inert minienvironment may be the only solution to future fabrication technologies when the device size is reduced further. In order to eliminate micro-contamination and to reduce native oxide growth on silicon surfaces, the wafer processing and the loading/unloading procedures of a process tool must be enclosed in an extremely high cleanliness minienvironment that is constantly flush with ultrapure nitrogen that contains no oxygen and moisture.

Different approaches in modem clean room design have been pursued in recent years with the advent of the ULSI technology. One is the utilization of a tunnel concept in which a corridor separates the process area from the service area in order to achieve a higher level of air cleanliness. Under the concept, the majority of equipment maintenance functions are conducted in low-classified service areas, while the wafers are handled and processed in more costly high-classified process tunnels. For instance, in a process for 16M and 64M DRAM products, the requirement of contamination control in a process environment is so stringent that the control of the enclosure of the process environment for each process tool must be considered. This stringent requirement creates a new minienvironment concept which is shown in FIG. 1. Within the enclosure of the minienvironment of a process tool 10, an extremely high cleanliness class of 0.1 (which means the number of particles at sizes larger than 0.1 µm per cubic foot) is maintained, in contrast to a cleanliness class of 1000 for the overall production clean room area 12. In order to maintain the high cleanliness class inside the process tool 10, the loading and unloading sections 14 of the process tool must be handled automatically by an input/output device such as a SMIF (standard mechanical interfaces) apparatus. A cassette of wafer can be transported into the process tool 10 by a SMIF pod 18 situated on top of the SMIF apparatus 20.

In a conventional SMIF apparatus 20 such as that shown in FIG. 1, the apparatus 20 consists of a robotic transfer system (not shown) or a robotic arm which is normally configured for gripping the top of a cassette 30 from a platform on which the cassette 30 placed (inside a pod). The robotic arm, sometimes replaced by a gripper assembly, is capable of transporting the cassette 30 into the process tool and place it onto a platform 16 vertically such that the cassette 30 is oriented horizontally. At the beginning of the process, an operator positions a SMIF pod 18 on top of a platform/elevator 22 which contains a cassette 30 holding, for instance, 24 wafers in an upright position. The elevator then descends into the SMIF apparatus 20 for the robotic arm to transport the cassette 30 into the process tool. The SMIF system 20 is therefore capable of automatically utilizing clean isolation technology to maintain a high class clean room effectiveness near wafers and processing equipment. The operation of the robotic arm or the gripper is controlled by an ancillary computer (not shown) or by the process tool 10. The cassette 30 carries wafers or other substrates that are being processed.

The SMIF apparatus 20 has a port (or opening) 24 which is intimately mated with an opening 26 in the sidewall 28 of the process tool 10. The SMIF pod 18 is a sealed container with an opening at the bottom and therefore is capable of preventing contamination to the cassette held therein. The pod may also be equipped by a tagging system for the automated identification and recognition of the parts contained in the pod to prevent mis-processing of the wafers and to track through the host computer of the product-lot serial numbers. The tagging system is mounted on the pod with a probe assembly mounted on the port of the SMIF apparatus 20. The SMIF apparatus 20 is therefore an effective interface between an operator and the process tool 10 in that the transporting of cassette can be conducted in a completely automated fashion to avoid human contact by the operator. This insures that the cassette 30 is transported through a highly clean environment into the process tool 10.

Occasionally, the SMIF apparatus 20 or the process tool 10 requires repair or maintenance procedures to be performed on them. When one of such requirements arises, the SMIF apparatus 20 must be disassembled from the process tool 10 and be physically pushed away in order to provide access to an operator for performing the repair or maintenance.

In a conventional set-up, the SMIF apparatus 20 is attached to the process tool 10 on the side 20 of the tool by a mechanical latch and by a number of bolts attached on the side that is opposite to the latch side. This is shown in FIG. 2. One side of the SMIF apparatus 20 provides a mechanical interlock 32 which is latched into an undercut 34 in the process machine 10. On the opposite side of the SMIF apparatus, bolts 38 are used to attach the apparatus to the process tool.

After a repair or maintenance schedule has been performed on the SMIF apparatus 20 or the process tool 10, the SMIF apparatus is reattached to the process tool by first latching the mechanical interlock 32 and then attaching the bolts 38. However, when the attachment of the mechanical interlock 32 or the bolts 38 is not properly performed such that the SMIF apparatus 20 is not properly attached to the process tool 10, there is no indication or warning signal to tell the operator that the reassembly process is incomplete. Therefore, when the loading of cassette 30 from a SMIF pod 18 is started which causes the movement of the robotic arm, the arm shifts the center of gravity of the SMIF apparatus 20 and thus cause the SMIF to move out of its supposed locked position. Since most SMIF apparatus are installed on wheels, the movement of the SMIF apparatus away from a process tool can easily occur by the shift in gravity caused by the movement of the robotic arm. The mis-position of the SMIF apparatus is not recognized by the host computer and therefore, the robotic arm does not realize when it has delivered the cassette to a position that is not its intended destination. The robotic arm releases the cassette when instruction from the host computer is received and the cassette is left in a unstable position in the process tool. The unstable cassette may tip-over and thus cause severe damage to the wafers when they fall out of the cassette leading to a severe drop in yield.

It is therefore an object of the present invention to provide a method of mounting a wafer loading device to a semiconductor process tool that does not have the drawbacks or shortcomings of a conventional mounting method.

It is another object of the present invention to provide a method of mounting a wafer loading device to a semiconductor process tool that includes the utilization of a warning device to indicate when the loading device is not properly attached to the process tool.

It is a further object of the present invention to provide a method for mounting a wafer loading device to a semiconductor process tool that is capable of providing a signal to a controller for disabling the loading device when a detection that the device is not properly mounted to the process tool is made.

It is another further object of the present invention to provide a method for mounting a wafer loading device to a semiconductor process tool that utilizes spring means in the mounting surface of the loading device such that the device pushes itself away from the process tool when it is not securely attached to the tool.

It is still another object of the present invention to provide a method for mounting a wafer loading device to a semiconductor process tool by using microswitches at the mounting surface of the device such that an improperly mounted device can be readily detected and a signal can be sent out to a controller for disabling the loading device.

SUMMARY OF THE INVENTION

In accordance with the present invention, a method for mounting a wafer loading device to a semiconductor process tool is provided by installing a sensor means in the mounting surface of the loading device such that an improper mating of the mounting surface of the device to a corresponding mounting surface on the process tool can be detected and then a signal can be sent to a controller for disabling the loading device.

In a preferred embodiment, a method for mounting a peripheral device to a semiconductor process tool can be carried out by first providing a semiconductor process tool that has a first mounting surface, then providing a peripheral device that has a second mounting surface adopted for mating intimately to the first mounting surface, the second mounting surface is equipped with sensor means capable of sending a first signal when the first and the second mounting surfaces are not mated properly, and then transmitting the first signal to a controller to disable the peripheral device.

In another embodiment, a method for mounting a wafer loading device to a semiconductor process tool can be carried out by first providing a semiconductor process tool that has a first mounting surface, then providing a wafer loading machine that has a second mounting surface adopted for mating intimately to the first mounting surface, the second mounting surface is equipped with sensor means that is capable of sending a first signal when the first and second mounting surfaces are not mated intimately, and then transmitting the first signal into a controller to disable the wafer loading device. The sensor means can be at least one microswitch that is capable of detecting a separation of the first mounting surface from the second mounting surface and then sending a signal to a controller or host computer when such detection is made. The second mounting surface may optionally be equipped with spring means that is capable of separating the first and the second mounting surfaces when they are not securely fastened together by mechanical means.

The present invention is further directed to a wafer loading device that includes a second mounting surface situated on one side of the wafer loading device adapted for mating to a first mounting surface situated on a semiconductor process tool, an opening in the second mounting surface for communicating with an opening in the first mounting surface such that wafers can be transported therethrough, a sensor in the second mounting surface that is capable of sending a first signal when the first and the second mounting surfaces are not intimately mated together, and a controller for receiving the first signal and disabling the wafer loading device.

BRIEF DESCRIPTION OF THE DRAWINGS

These and other objects, features and advantages of the present invention will become apparent from the following detailed description and the appended drawings in which:

FIG. 1 is an illustration of a cross-section of a conventional semiconductor process tool that has a wafer loading device attached thereto.

FIG. 2 is an illustration of a top view of a wafer loading device mounted to a semiconductor process tool in a conventional manner.

FIG. 3 is an illustration of a top view of the present invention wafer loading device equipped with microswitches and springs and a semiconductor process tool.

FIG. 4 is an illustration of a top view of the present invention wafer loading device partially attached to a semiconductor process tool.

DETAILED DESCRIPTION OF THE PREFERRED EMBODIMENT

The present invention provides a method for mounting a wafer loading device, or any other type of peripheral devices to a semiconductor process tool by installing a sensor means in the mounting surface of the device such that any improper mating between the mounting surfaces on the peripheral device and the process tool can be detected so that a signal can be sent out to disable the peripheral device.

Referring initially to FIG. 3, wherein an illustration of a top view of a peripheral device, or a wafer loading device, 40 is shown positioned next to a semiconductor process tool 10. The semiconductor process tool can be one of any frequently used process machines such as a chemical vapor deposition machine, a physical vapor deposition machine, an etcher, an ion implanter, a diffusion chamber or a furnace for thermal oxidation or annealing. The detailed construction of the process tool 10 is not illustrated in FIG. 3. The peripheral device 40 is equipped with a mechanical interlock, or a latch 42 for mating and locking to a latch opening 46. On the opposite end of the latch 42, is a ledge 48 equipped with bolt holes 52. Bolts 56 are used to attach the peripheral device 40 and locking it to the semiconductor process tool 10 through bolt holes 58 located in the process tool. Two microswitches 62 are installed in the surface 66 of the peripheral device, or the wafer loading device, 40. When either one or both of the microswitches 62 are activated because they are not in intimate contact with the mating surface 68 on the semiconductor process tool 10, a signal is sent out from the microswitches to a controller such as a host computer for the process tool 10 or an independent microprocessor (not shown). The signal causes the controller to disable the peripheral device 40 and to stop its motion.

To illustrate the operation of the microswitches, FIG. 4 shows that when the peripheral device 40 is interlocked into latch 46 on one end but is not properly attached by bolt 56 into bolt hole 58, a signal from microswitch 62 is sent out to a controller (not shown) which in turn disable or stop the peripheral device 40 from making any further motion.

The present invention method may optionally employ spring means 70 such as that shown in FIG. 3 that are installed in the mounting surface 66 of the peripheral device 60. The spring means 70 provide a valuable tool for an operator to readily identify a situation where the peripheral device 40 is not properly mounted to the process tool 10. For instance, as shown in FIG. 4, when bolt 56 is not properly attached to bolt hole 58, spring 70 pushes the surface 66 on the peripheral device 40 away from surface 68 on the process tool 10. This allows a visual observation by an operator that the peripheral device 40 is not properly mounted to the process tool 10. Without the spring means 70, the peripheral device 40 may appear to be securely mounted to the process tool 10 even when the two components have not been securely assembled together. Problem arises when the loading action of the wafer loading device 40 is started with the movement of the robotic arm which, due to a shift in the center of gravity, moves the wafer loading device 40 away from the process tool 10 and subsequently cause problem to the cassette being transported. The spring can be made of a variety of materials, as long as the spring constant is matched to the mass of the peripheral device 40 (i.e., frequently mounted on wheels) such that it exerts sufficient force to push the peripheral device 40 away from the process tool 10 when they are not securely locked together by bolts 56.

It should be noted that while two microswitches 62 and two springs 70 are illustrated in the present invention preferred embodiment, as shown in FIGS. 3 and 4, the present invention method can be practiced by using any number of microswitches and springs installed on the peripheral device 40. The number of microswitches and springs to be used can be readily determined by the size of the peripheral device 40, the mass of the device and the configuration of mounting surfaces on the device and the tool. The present invention method therefore can be practiced by those skilled in the art in any other variation while staying within the spirit of the invention.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the invention.

The embodiment of the invention in which an exclusive property or privilege is claimed are defined as follows:

1. A method for mounting a peripheral device to a semiconductor process machine comprising the steps of:
   providing a semiconductor process machine having a first mounting surface,
   providing a peripheral device having a second mounting surface adapted for mating to said first mounting surface, said second mounting surface being equipped with sensor means capable of sending a first signal when said first and said second mounting surfaces are not mated and spring means capable of separating said first and second mounting surfaces when said surfaces are not fastened together by mechanical means, and
   transmitting said first signal into a control means and disabling said peripheral device.

2. A method according to claim 1, wherein said sensor means comprises at least one switch.

3. A method according to claim 2, wherein said at least one switch is capable of detecting a separation of said first mounting surface from said second mounting surface and sending a first signal to said controller when said detection is made.

4. A method according to claim 1, wherein said mechanical means is at least one bolt.

5. A method according to claim 1, wherein said at least one switch comprises two switches.

6. A method according to claim 1, wherein said spring means comprises at least one spring having a spring constant sufficient to separate said first mounting surface from said second mounting surface when said surfaces are not fastened together.

7. A method according to claim 1, wherein said peripheral device is a wafer loading device.

8. A method according to claim 1, wherein said peripheral device is a machine interface device.

9. A method for mounting a wafer loading device to a semiconducting process machine comprising the steps of:
   providing a semiconductor process machine having a first mounting surface,
   providing a wafer loading machine having a second mounting surface adapted for mating to said first mounting surface, said second mounting surface being equipped with sensor means capable of sending a first signal when said first and said second mounting surfaces are not mated together and spring means capable of separating said first and second mounting surfaces when said surfaces are not fastened together by mechanical means, and
   transmitting said first signal to a control means and disabling said wafer loading device.

10. A method according to claim 9, wherein said sensor means comprises at least one switch.

11. A method according to claim 9, wherein said at least one switch is capable of detecting a separation of said first mounting surface from said second mounting surface and sending a first signal to said controller when said detection is made.

12. A method according to claim 9, wherein said wafer loading device is a machine interface device.

13. A method according to claim 9, wherein said wafer loading device is equipped with an opening in said second mounting surface adapted to communicate with an opening in said first mounting surface of said semiconductor process machine for transporting a wafer cassette.

14. A method according to claim 9, wherein said semiconductor process machine is selected from the group consisting of a chemical vapor deposition machine, a physical vapor deposition machine, and etcher, an ion implanter and a furnace.

15. A wafer loading device comprising:
   means for transporting wafers,
   a second mounting surface situated on one side of the device adapted for mating to a first mounting surface situated on a semiconductor process machine, an opening in said second mounting surface for communicating with an opening in said first mounting surface such that wafers can be transported therethrough, a sensor means in said second mounting surface capable of sending a first signal when said first and said second mounting surfaces are not mated together, a control means for receiving said first signal and disabling said wafer loading device, and a spring means installed in said second mounting surface for pushing away said first mounting surface when said two surfaces are not fastened together by mechanical means.

16. A wafer loading device according to claim 5, wherein said sensor means comprises at least one switch.

* * * * *